US008936898B2

(12) United States Patent
Nam et al.

(10) Patent No.: US 8,936,898 B2
(45) Date of Patent: Jan. 20, 2015

(54) PHOTOSENSITIVE RESIN COMPOSITION FOR IMPRINTING PROCESS AND METHOD FOR FORMING ORGANIC LAYER OVER SUBSTRATE

(75) Inventors: Yeon Heui Nam, Gyeonggi-do (KR); Jin Wuk Kim, Gyeonggi-do (KR); Tae Joon Song, Gyeonggi-do (KR); Seong Pil Cho, Gyeonggi-do (KR); Byung Uk Kim, Gyeonggi-do (KR); Seung Hyup Shin, Gyeonggi-do (KR); Jun Yong Song, Gyeonggi-do (KR); Myoung Soo Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/617,108

(22) Filed: Nov. 12, 2009

(65) Prior Publication Data
US 2010/0123269 A1    May 20, 2010

(30) Foreign Application Priority Data
Nov. 14, 2008    (KR) ........................ 10-2008-0113688

(51) Int. Cl.
| | | |
|---|---|---|
| B28B 1/14 | (2006.01) | |
| C08F 2/48 | (2006.01) | |
| B82Y 10/00 | (2011.01) | |
| B82Y 40/00 | (2011.01) | |
| G03F 7/00 | (2006.01) | |
| G03F 7/027 | (2006.01) | |

(52) U.S. Cl.
CPC . *C08F 2/48* (2013.01); *B82Y 10/00* (2013.01); *B82Y 40/00* (2013.01); *G03F 7/0002* (2013.01); *G03F 7/027* (2013.01)

USPC ........ 430/270.1; 264/293; 264/494; 264/496; 264/299

(58) Field of Classification Search
USPC ................ 430/270.1; 264/293, 299, 494, 496
See application file for complete search history.

(56) References Cited

U.S. PATENT DOCUMENTS

| | | | | |
|---|---|---|---|---|
| 3,899,611 | A | * | 8/1975 | Hall .............................. 427/488 |
| 4,205,018 | A | * | 5/1980 | Nagasawa et al. ............ 525/404 |
| 4,271,259 | A | | 6/1981 | Breslow et al. |
| 6,770,721 | B1 | | 8/2004 | Kim |
| 6,913,352 | B2 | * | 7/2005 | Yoshihiro et al. ............. 347/100 |
| 2002/0084553 | A1 | * | 7/2002 | Nun et al. ..................... 264/284 |
| 2003/0149133 | A1 | * | 8/2003 | Lau et al. ...................... 523/160 |
| 2003/0166814 | A1 | * | 9/2003 | Sparrowe et al. ............. 526/319 |
| 2004/0110856 | A1 | * | 6/2004 | Young et al. ...................... 522/6 |
| 2004/0115558 | A1 | * | 6/2004 | Yang et al. ................. 430/270.1 |
| 2005/0226582 | A1 | * | 10/2005 | Nagelvoort et al. .......... 385/128 |
| 2006/0063858 | A1 | * | 3/2006 | Kang et al. .................... 523/160 |

(Continued)

FOREIGN PATENT DOCUMENTS

| | | |
|---|---|---|
| JP | 10-116891 | 5/1998 |
| JP | 2007-296683 A | 11/2007 |

(Continued)

*Primary Examiner* — Amjad Abraham
(74) *Attorney, Agent, or Firm* — Morgan, Lewis & Bockius LLP

(57) ABSTRACT

A photosensitive resin composition and a method for forming an organic film on a substrate are provided. Because the photosensitive resin composition for imprinting includes an erythrotol-based monomer or oligomer, an organic film formed by the photosensitive resin composition for imprinting has improved restoring force. Therefore, the photosensitive resin composition is appropriate for imprinting processes.

9 Claims, 2 Drawing Sheets

(56) References Cited

U.S. PATENT DOCUMENTS

2006/0286383 A1* 12/2006 Gilmer ..................... 428/412
2008/0138580 A1* 6/2008 Low et al. ................. 428/156
2009/0322990 A1* 12/2009 Kawana et al. ............ 349/68
2010/0130661 A1* 5/2010 Takeuchi et al. .......... 524/419

FOREIGN PATENT DOCUMENTS

| KR | 10-2001-0032918 A | 4/2001 | |
|---|---|---|---|
| WO | WO 2007123183 A1 * | 11/2007 | .......... G02F 1/33357 |
| WO | WO 2008114765 A1 * | 9/2008 | .............. C08F 20/38 |

* cited by examiner

PHOTOSENSITIVE RESIN COMPOSITION FOR IMPRINTING PROCESS AND METHOD FOR FORMING ORGANIC LAYER OVER SUBSTRATE

CROSS-REFERENCE TO RELATED APPLICATIONS

The present application claims priority under 35 U.S.C. 119 to Korean Patent Application No. 10-2008-0113688 (filed on Nov. 14, 2008), which is hereby incorporated by reference in its entirety.

BACKGROUND

The present disclosure relates to a photosensitive resin composition for an imprinting process and a method for forming an organic layer over a substrate using the same.

Recently, the microphotolithography process has been widely used to form micro patterns in the LCD manufacturing processes and semiconductor manufacturing processes.

In the photolithography process, the design rule (for pattern line width) is determined according to the wavelength of light used in the exposure process. Therefore, judging from the current level of technology, it is very difficult to form an ultra-micro pattern, for example, having a design rule of 100 nm or less, on a substrate using a photolithography process.

In addition, expensive equipment for exposure, etc. is used to make patterns ultrafine, which requires high initial investment and sharply raises the price of high-resolution masks, reducing the merits of such an approach.

Also, considerable processing time is needed, and processes are become very complicated because exposure, post-exposure baking, development, post-development baking, etching, cleaning processes, etc. must be performed whenever a pattern is formed.

To overcome these limitations, an imprinting process was developed as a novel process by Stephen Chou et al. at Princeton University, USA in order to imprint the first nano-scale pattern. This imprinting process is a method for forming patterns, involving pre-forming a required shape on the surface of a relatively high-strength material and then stamping the material onto another material to form a pattern, or preparing a mold on which a desired pattern is formed, bonding the mold to a curable composition coated on a metal film or an organic film and thermosetting or photocuring the combined mold and composition, and is advantageous for process simplification and ultrafine pattern formation.

SUMMARY

Embodiments provide a photosensitive resin composition for imprinting to form an organic film with improved restoring force, chemical resistance, heat resistance, dimensional stability and curing density, and a method for forming an organic film on a substrate using the same.

Embodiments also provide a photosensitive resin composition for imprinting, including an erythritol-based monomer or oligomer represented by one of the following Formulas 1, 2, and 3.

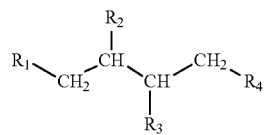

Formula 1)

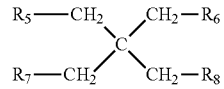

Formula 2)

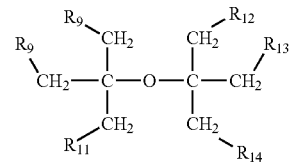

Formula 3)

Wherein, R1, R2, R3, and R4 is each selected from the group consisting of hydroxyl group, hydrogen, alkyl group, and acrylate, R5, R6, R7, and R8 is each selected from the group consisting of hydroxyl group, hydrogen, alkyl group, and acrylate, and R9, R10, R11, R12, R13, and R14 is each selected from the group consisting of hydroxyl group, hydrogen, alkyl group, and acrylate.

In one embodiment, a method for forming an organic film on a substrate includes: disposing the photosensitive resin composition on the substrate; disposing a molding frame on the photosensitive resin to form a pre-pattern; and exposing the photosensitive resin composition with which the pre-pattern is formed to be cured.

In another embodiment, a photosensitive resin composition for imprinting may include an erythritol-based monomer or oligomer.

Thus, an organic membrane formed with a photosensitive resin composition for imprinting according to embodiments has improved restoring force, chemical resistance, heat resistance, dimensional stability and curing density.

Thus, a photosensitive resin composition according to embodiments is appropriate for imprinting processes, and embodiments provide a method for easily forming an organic film including a micro pattern on a substrate.

The details of one or more embodiments are set forth in the accompanying drawings and the description below. Other features will be apparent from the description and drawings, and from the claims.

DETAILED DESCRIPTION OF THE EMBODIMENTS

Figure 1:
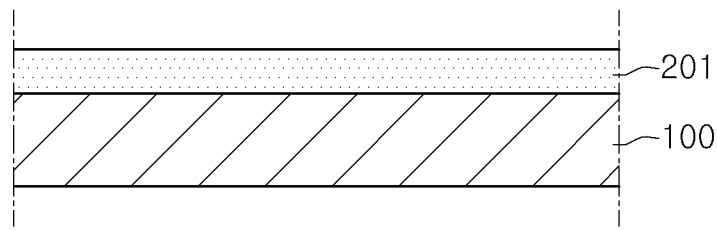
FIGS. 1 to 4 are views illustrating a process of forming organic film on a substrate using photosensitive resin composition according to embodiments.

In the descriptions of embodiments, it will be understood that when a substrate, film, or layer is referred to as being 'on' or 'under' each substrate, film, or layer, it can be directly 'on' or 'under' another substrate, another film, or another layer, or indirectly 'on' or 'under' another substrate, another film or another layer. The description of on or under of each element will be with reference to the figures. The dimension of each element in the figure may be exaggerated for description, and does not mean that it is what is actually applied.

In an embodiment, a photosensitive resin composition for imprinting includes an erythritol-based monomer or oligomer represented by one of the following Formulas 1, 2, and 3; an ethylene-based monomer; a crosslinking agent with at least two ethylene-based double bonds; and a photopolymerization initiator.

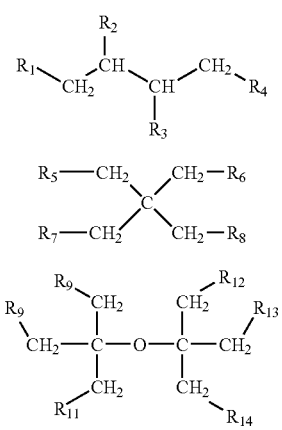

Wherein, R1, R2, R3, and R4 is each selected from the group consisting of hydroxyl group, hydrogen, alkyl group, and acrylate, R5, R6, R7, and R8 is each selected from the group consisting of hydroxyl group, hydrogen, alkyl group, and acrylate, and R9, R10, R11, R12, R13, and R14 is each selected from the group consisting of hydroxyl group, hydrogen, alkyl group, and acrylate.

In an embodiment, R1 to R14 is each selected from the group consisting of hydroxyl group, hydrogen, methyl group, and acrylate.

In an embodiment, R1 to R14 is each selected from the group consisting of hydroxyl group, hydrogen, methyl group, and the following Formula 4.

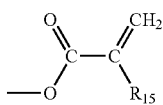

In Formula 4, R15 may be selected from hydrogen or alkyl group. More specifically, R15 may be hydrogen or methyl group.

A photosensitive resin composition for imprinting according to an embodiment includes a copolymer formed by polymerization of monomers or oligomers represented by Formulas 1, 2, or 3.

In an embodiment, the erythritol-based monomer, oligomer, or copolymer is present in an amount of about 1% to about 20% by weight of the composition.

More preferably, the erythritol-based monomer, oligomer, or copolymer is present in an amount of about 1% to about 10% by weight of the composition.

In particular, when an amount of the erythritol-based monomer, oligomer, or copolymer is less than 1% by weight of the composition, it is difficult not only to increase its restoring force, but also to expect that its curing density and its resistance to a mixture of acid or base may be improved at the same time.

In addition, when an amount of the erythritol-based monomer, oligomer, or copolymer is more than 20% by weight of the composition, an increase in the viscosity of the photosensitive resin composition and deterioration in its adhesion with a lower film may be caused.

Specific examples of the erythritol-based monomer, oligomer, or copolymer may be erythritol, erythritol monoacrylate, erythritol diacrylate, erythritol triacrylate, erythritol tetraacrylate, pentaerythritol, pentaerythritol monoacrylate, pentaerythritol diacrylate, pentaerythritol triacrylate, pentaerythritol tetraacrylate, dierythritol, dierythritol monoacrylate, dierythritol diacrylate, dierythritol triacrylate, dierythritol tetraacrylate, dierythritol pentaacrylate, dierythritol hexaacrylate, dipentaerythritol, dipentaerythritol monoacrylate, dipentaerythritol diacrylate, dipentaerythritol triacrylate, dipentaerythritol tetraacrylate, dipentaerythritol pentaacrylate, dipentaerythritol hexaacrylate or derivatives thereof, or ester compounds thereof, or metharylates thereof. The materials may be also used alone or in mixture with at least two kinds thereof for preparation of the photosensitive resin composition for imprinting.

In an embodiment, the ethylene-based monomer is present in an amount of about 9% to about 80% by weight of the composition.

More preferably, the ethylene-based monomer is present in an amount of about 20% to about 60% by weight of the composition.

When an amount of the ethylene monomer is less than about 10% by weight of the composition, its strength may decrease because an organic film formed by the photosensitive resin composition does not have a sufficient molecular weight. In addition, when an amount of the ethylene monomer is more than about 80% by weight of the composition, the organic film may significantly shrink because an amount of unreacted photosensitive resin composition increases.

Specific examples of the ethylene monomer may be isobutylacrylate, tert-butylacrylate, laurylacrylate, methylmethacrylate, alkylacrylate, cyclohexylacrylate, isobornylacrylate, benzylmethacrylate, benzylacrylate, 2-hydroxyacrylate, trimethoxybutylacrylate, ethylcarbitolacrylate, phenoxyethylacrylate, 4-hydroxybutylacrylate, phenoxypolyethyleneglycolacrylate, 2-hydroxyethylacrylate, 2-hydroxypropylacrylate, 2-acryloxyethyl-2-hydroxypropylphthalate, 2-hydroxy-3-phenoxypropylacrylate, and methacrylates thereof. In addition, they include acrylates including a halogenated compound such as 3-fluoroethylacrylate and 4-fluoropropylacrylate, and methacrylates thereof. They include acrylates including a siloxane group such as triethylsiloxylethylacrylate, and methacrylates thereof. They also olefins including an aromatic group such as styrene and 4-methoxystyrene. The materials may be used alone or in mixture with at least two kinds thereof for preparation of the photosensitive resin composition for imprinting.

In an embodiment, the crosslinking agent is present in an amount of about 9% to about 80% by weight of the composition.

More preferably, the crosslinking agent is present in an amount of about 20% to about 60% by weight of the composition. When an amount of the crosslinking agent is less than about 10% by weight of the composition, an insufficient degree of cure of an organic film formed by the photosensitive resin composition causes an incomplete formation of the pattern. In addition, when an amount of the crosslinking agent is more than 80% by weight of the composition, the degree of cure of the organic film may excessively increase or an incomplete reaction of the photosensitive resin composition may occur.

Specific examples of the crosslinking agent may be 1,4-butanediol acrylate, 1,3-butylene glycol diacrylate, polyethylene glycol diacrylate, sorbitol triacrylate, bisphenol A diacrylate derivative, trimethylpropane triacrylate, or methacrylates thereof. The materials may be used alone or in mixture with at least two kinds thereof for preparation of the photosensitive resin composition for imprinting.

In an embodiment, the photopolymerization initiator is present in an amount of about 0.1% to 10% by weight of the composition.

More preferably, the photopolymerization initiator is present in an amount of about 1% to about 6% by weight of the composition. When an amount of the photopolymerization initiator is less than about 0.1% by weight of the composition, the rate of photocuring of the photosensitive resin composition decreases. In addition, when an amount of the photopolymerization initiator is more than about 10% by weight of the composition, properties, transmissivity, or curing margin of an organic film to be formed may deteriorate because reaction-inhibitory effects of the photosensitive resin composition occur.

Specific examples of the photopolymerization initiator may be acetophenone-based compound such as 2,2'-diethoxyacetophenone, 2,2'-dibutoxyacetophenone, 2-hydroxy-2-methylpropiophenone, p-t-butyltrichloroacetophenone, p-t-butyldichloroacetophenone, benzophenone, 4-chloroacetophenone, 4,4'-dimethylamino benzophenone, 4,4'-dichloro benzophenone, 3,3'-dimethyl-2-methoxybenzophenone, 2,2'-dichloro-4-phenoxyacetophenone, 2-methyl-1-(4-(methylthio)phenyl)-2-morpholinopropan-1-one, and 2-benzyl-2-dimethylamino-1-(4-morpholinophenyl)-butan-1-one. They also include benzophenone-based compound such as benzophenone, benzoyl benzoic acid, benzoyl benzoic acid methyl, 4-phenyl benzophenone, hydroxy benzophenone, acrylic benzophenone, 4,4'-bis(dimethyl amino) benzophenone, and 4,4'-bis(diethylamino)benzophenone. They also include thioxanthone-based compound such as thioxanthone, 2-crolthioxanthone, 2-methylthioxanthone, isopropyl thioxanthone, 2,4-diethyl thioxanthone, and 2,4-diisopropyl thioxanthone, 2-chlorothioxanthone; and benzoin-based compound such as benzoin, benzoin methyl ether, benzoin ethyl ether, benzoin isopropyl ether, benzoin isobutyl ether, and benzyldimethylketal. They also include triazine-based compound such as 2,4,6,-trichloro s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl 4,6-bis(trichloromethyl)-s-triazine, bis(trichloromethyl)-6-styryl s-triazine, 2-(naphto1-yl)-4,6-bis(trichloromethyl)-s-triazine, 2-(4-methoxynaphto1-yl)-4,6-bis(trichloromethyl)-s-triazine, 2-4-trichloromethyl(piperonyl)-6-triazine, and 2-4-trichloromethyl (4'-methoxystyryl)-6-triazine. The materials may be used alone or in mixture with at least two kinds thereof for preparation of the photosensitive resin composition for imprinting. More preferably, acetophenone-based compound may be used as the photopolymerization initiator to efficiently secure the curing margin of an organic film to be formed.

FIGS. 1 to 4 are cross-sections illustrating a process of forming an organic film on a substrate using a photosensitive resin composition for imprinting according to embodiments.

Referring to FIG. 1, a photosensitive resin composition was applied on a substrate 100 to form a photosensitive resin layer 201.

The substrate may be a silicon substrate including a metal layer, a polymer layer or an inorganic layer, a ceramic substrate, a glass substrate or a film substrate.

The photosensitive resin compound has the composition ratios as described above. The photosensitive resin composition for imprinting is applied on the substrate 100 by a process such as spin coating, roller coating, or slit coating. The thickness of the photosensitive resin layer 201 may be about 0.5 μm to about 10 μm.

Figure 2:
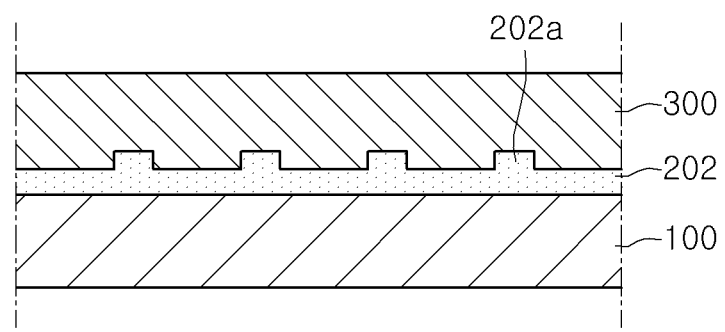

Referring to FIG. 2, a mold 300 is disposed on the photosensitive resin layer 201. The mold 300 is a molding frame for molding the photosensitive resin layer 201. The mold 300 may be composed of an organic material or an inorganic material, and an example of the mold 300 may include polydimethylsiloxane (PDMS).

In addition, a groove pattern is formed at the bottom of the mold 300. The mold 300 is transparent.

Pressure is applied on the photosensitive resin layer 201 by the mold 300, and a pre-pattern 202a is formed on the photosensitive resin layer 201. That is, the groove pattern is filed with the photosensitive resin composition by the pressure.

Figure 3:
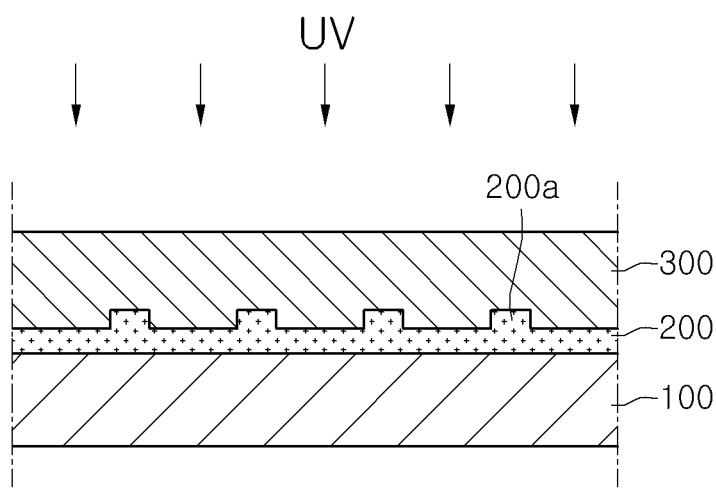

Referring to FIG. 3, UV light is irradiated on the photosensitive resin layer 202 on which the pre-pattern 202a is formed, the photosensitive resin layer 202 on which the pre-pattern 202a is formed is cured, and an organic film 200 including the pattern is formed. Then, UV light with a wavelength of between about 190 nm and about 450 nm may be irradiated on the photosensitive resin layer 201. More preferably, UV light with a wavelength of between about 200 nm and about 400 nm may be irradiated on the photosensitive layer 201.

Alternatively, electron beam may be irradiated on the photosensitive resin layer 201.

Figure 4:
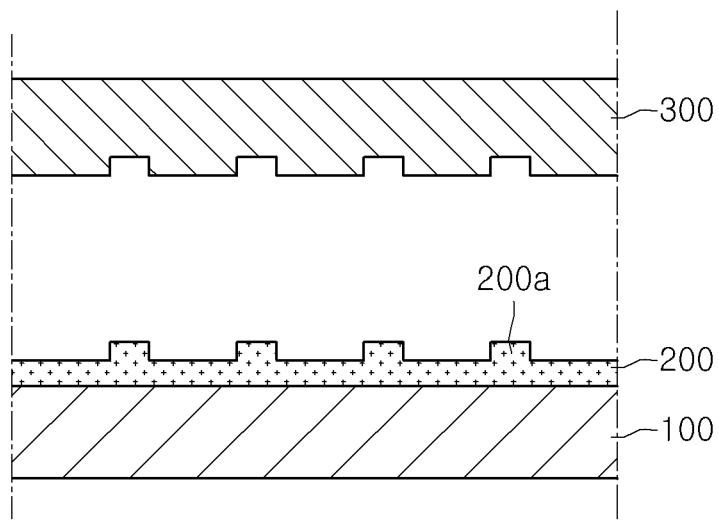

Referring to FIG. 4, the mold 300 is removed from the organic film 200, and an organic film 200 having a pattern 200a is formed on the substrate 100.

Subsequently, an additional heat treatment is performed on the organic film 200 to improve the mechanical strength and acid resistance of the organic film 200 and its adhesion with the substrate 100.

The organic film 200 may be an organic insulating layer, an overcoat, and a spacer, and in particular, an organic film including a spacer must have a certain level of restoring force.

Then, because the photosensitive resin composition includes an erythritol-based monomer, oligomer, or copolymer, the organic film 200 has improved restring force. Thus, the organic film 200 may include a spacer with enhanced performances.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Experimental Example 1

About 10% erythritol diacrylate, about 30% hydroxybutylacrylate, about 30% phenoxyethylacrylate, about 25% 1,4-butanediol diacrylate, and about 5% Irga-cure 369 (Ciba-Geigy) as a photopolymerization initiator by weight of the composition were homogeneously mixed with each other for 6 hours to form a photosensitive resin composition #1.

Subsequently, the photosensitive resin composition #1 was homogeneously applied on a glass substrate at a thickness of about 2.5 μm, and then a PDMS mold having a flat bottom surface was contacted with the applied photosensitive resin composition #1.

Subsequently, UV light at a wavelength of about 365 nm was irradiated through the PDMS mold on the photosensitive resin composition #1 for about 1 min.

In this way, an organic film #1 was formed on the glass substrate.

Experimental Example 2

About 10% erythritol triacrylate, about 30% hydroxybutylacrylate, about 25% phenoxyethylacrylate, about 30% 1,4-butanediol diacrylate, and about 5% Irga-cure 369 as a photopolymerization initiator by weight of the composition were mixed under the same conditions as in Experimental Example 1 to form a photosensitive resin composition #2.

Subsequently, the same procedure as in Experimental Example 1 was performed using the photosensitive resin composition #2 to form an organic film #2.

Experimental Example 3

About 10% dierythritol monoacrylate, about 30% hydroxybutylacrylate, about 25% phenoxyethylacrylate, about 30% 1,4-butanediol diacrylate, and about 5% Irga-cure 369 as a photopolymerization initiator by weight of the composition were mixed under the same conditions as in Experimental Example 1 to form a photosensitive resin composition #3.

Subsequently, the same procedure as in Experimental Example 1 was performed using the photosensitive resin composition #3 to form an organic film #3.

Experimental Example 4

About 10% dierythritol diacrylate, about 30% hydroxybutylacrylate, about 25% phenoxyethylacrylate, about 30% 1,4-butanediol diacrylate, and about 5% Irga-cure 369 as a photopolymerization initiator by weight of the composition were mixed under the same conditions as in Experimental Example 1 to form a photosensitive resin composition #4.

Subsequently, the same procedure as in Experimental Example 1 was performed using the photosensitive resin composition #4 to form an organic film #4.

Comparative Example

About 40% hydroxybutylacrylate, about 25% phenoxyethylacrylate, about 30% 1,4-butanediol diacrylate, and about 5% Irga-cure 369 as a photopolymerization initiator by weight of the composition were mixed under the same conditions as in Experimental Example 1 to form a photosensitive resin composition #5.

Subsequently, the same procedure as in Experimental Example 1 was performed using the photosensitive resin composition #2 to form an organic film #5.

The performances of the organic films #1, #2, #3, #4, and #5 were measured according to the following reference.

When a force of about 100 mN was each applied on the organic films using a restoring force measuring device, a degree of pattern restoration was each measured. Each of the restoring forces of the organic films was assessed according to the following references.

A: when a restoring force is about 70% or more
B: when a restoring force is about 60% or more
C: when a restoring force is about 50% or more
D: when a restoring force is about 40% or more.

The organic films were each thermoset by heating in an oven at about 230° C. for about 60 min and each immersed in a HCl solution at a concentration of 15% to measure the rate of thickness change. Each of the chemical resistances of the organic films was assessed according to the following references.

A: when the rate of thickness change is less than about 1%
B: when the rate of thickness change is about 1% or more, and less than about 3%
C: when the rate of thickness change is about 3% or more, and less than about 5%
D: when the rate of thickness change is about 5% or more.

Some of the organic films were each collected and a weight decrease was each measured by a thermogravimetry analyzer (TGA) while maintaining the films at about 230° C. for about 30 min. Each of the heat resistances of the organic films was assessed according to the following references.

when a weight decrease is less than about 1%
when a weight decrease is about 1% or more and less than about 3%
when a weight decrease is about 3% or more and less than about 5%
when a weight decrease is about 5% or more.

The organic films were each thermoset by heating in an oven at about 230° C. for about 60 min and their thicknesses were each measured before and after the thermosetting. Then, the dimensional stability of the organic films was each assessed according to the following references.

when a thickness decrease is less than about 5%
when a thickness decrease is about 5% or more and less than about 10%
when a thickness decrease is about 10% or more and less than about 15%
when a thickness decrease is more than about 15%

When a force of about 50 mN was each applied on the organic films using a dynamic ultra micro hardness tester, each of the maximum deformations was measured. Then, each of the curing densities of the organic films was assessed according to the following references.

A: when the deformation is less than about 30%
B: when the deformation is about 30% or more and less than about 60%
C: when the deformation is about 60% or more and less than about 80%
D: when the deformation is about 805 or more As indicated in Table 1, it can be known that each of the organic films formed by photosensitive resin compositions #1, #2, #3, and #4 including erythritol-based monomers, oligomers, or copolymers has not only improved restoring force, chemical resistance, and curing density, but also a certain level of heat resistance and dimensional stability. That is, it is determined that the photosensitive resin compositions #1, #2, #3, and #4 are appropriate for imprinting processes.

TABLE 1

| Classification | Restoring Force | Chemical Resistance | Heat Resistance | Dimensional Stability | Curing Density |
|---|---|---|---|---|---|
| Experimental Example 1 | B | B | B | B | B |
| Experimental Example 2 | B | B | B | B | B |
| Experimental Example 3 | A | B | B | B | A |
| Experimental Example 4 | B | B | B | B | B |
| Comparative Example | D | C | B | A | C |

What is claimed is:

1. A photosensitive resin composition, consisting of:
hydroxybutylacrylate and phenoxyethylacrylate;
a crosslinking agent with at least two ethylene-based double bonds;
a photopolymerization initiator; and
an erythritol-based monomer or oligomer selected from the group consisting of erythritol, erythritol monoacrylate, erythritol diacrylate, erythritol triacrylate, erythritol tetraacrylate, pentaerythritol monoacrylate, pentaerythritol diacrylate, pentaerythritol triacrylate dierythritol, dierythritol monoacrylate, dierythritol diacrylate, dierythritol triacrylate, dierythritol tetraacrylate, dierythritol pentaacrylate, dierythritol hexaacrylate, dipentaerythritol, dipentaerythritol monoacrylate, dipentaerythritol triacrylate, dipentaerythritol tetraacrylate, dipentaerythritol pentaacrylate, and dipentaerythritol hexaacrylate, wherein
the erythritol-based monomer or oligomer is present in an amount of 1% to 20% by weight of the composition,
the hydroxybutylacrylate and phenoxyethylacrylate are present in an amount of 20% to 60% by weight of the composition,
the crosslinking agent is present in an amount of 20% to 60% by weight of the composition,
the photopolymerization initiator is present in an amount of 0.1% to 10% by weight of the composition,
the crosslinking agent is selected from the group consisting of 1,4-butanediol acrylate, 1,3-butylene glycol diacrylate, sorbitol triacrylate, bisphenol A diacrylate derivative, trimethylpropane triacrylate, and methacrylates thereof,
when a force of about 100 mN was applied to an organic film formed from the resin composition, a pattern restoration force of about 60% or more was measured, and
when an organic film formed from the resin composition was heated in an oven at about 230° C. for about 60 min and immersed in a 15% HCl solution, a rate of change in the thickness of the film was measured to be from about 1% to less than about 3%.

2. The composition according to claim 1, wherein the crosslinking agent comprises 1,4-butanediol diacrylate.

3. A method for forming an organic film on a substrate, comprising:
disposing a photosensitive resin composition consisting of hydroxybutylacrylate and phenoxyethylacrylate, a crosslinking agent with at least two ethylene-based double bonds,
a photopolymerization initiator and
an erythritol-based monomer or oligomer selected from the group consisting of erythritol, erythritol monoacrylate, erythritol diacrylate, erythritol triacrylate, erythritol tetraacrylate, pentaerythritol monoacrylate, pentaerythritol diacrylate, pentaerythritol triacrylate dierythritol, dierythritol monoacrylate, dierythritol diacrylate, dierythritol triacrylate, dierythritol tetraacrylate, dierythritol pentaacrylate, dierythritol hexaacrylate, dipentaerythritol, dipentaerythritol monoacrylate, dipentaerythritol triacrylate, dipentaerythritol tetraacrylate, dipentaerythritol pentaacrylate, and dipentaerythritol hexaacrylate;
disposing a transparent molding frame on the photosensitive resin to form a pre-pattern; and
exposing the photosensitive resin composition with which the pre-pattern is formed to be cured,
wherein
the erythritol-based monomer or oligomer improves restoring force of the organic film,
the erythritol-based monomer or oligomer is present in an amount of 1% to 20% by weight of the composition,
the hydroxybutylacrylate and phenoxyethylacrylate are present in an amount of 20% to 60% by weight of the composition,
the crosslinking agent is present in an amount of 20% to 60% by weight of the composition,
the photopolymerization initiator is present in an amount of 0.1% to 10% by weight of the composition, and
the crosslinking agent is selected from the group consisting of 1,4-butanediol acrylate, 1,3-butylene glycol diacrylate, sorbitol triacrylate, bisphenol A diacrylate derivative, trimethylpropane triacrylate, and methacrylates thereof,
when a force of about 100 mN was applied to the organic film, a pattern restoration force of about 60% or more was measured, and
when the organic film was heated in an oven at about 230° C. for about 60 min and immersed in a 15% HCl solution, a rate of change in the thickness of the film was measured to be from about 1% to less than about 3%.

4. The composition according to claim 1, wherein the erythritol-based monomer or oligomer is present in an amount of 1% to 10% by weight of the composition.

5. The method according to claim 3, wherein the erythritol-based monomer or oligomer is present in an amount of 1% to 10% by weight of the composition.

6. The method according to claim 3, wherein the photosensitive resin composition is exposed and cured on the transparent molding frame.

7. The composition according to claim 1, wherein the hydroxybutylacrylate and phenoxyethylacrylate are the only ethylene-based monomers present in the composition.

8. The composition according to claim 1, wherein the erythritol-based monomer or oligomer is present in an amount of 1% to 10% by weight of the composition and the photopolymerization initiator is present in an amount of 5% by weight of the composition.

9. The method according to claim 3, wherein the hydroxybutylacrylate and phenoxyethylacrylate are the only ethylene-based monomers present in the composition.

* * * * *